United States Patent [19]

Bessette et al.

[11] 4,425,196

[45] Jan. 10, 1984

[54] PHOTOELECTROCHEMICAL PLATING OF SILVER

[75] Inventors: Jeffrey R. Bessette, Piscataway; Paul A. Kohl, Chatham, both of N.J.

[73] Assignee: Bell Telephone Laboratories, Incorporated, Murray Hill, N.J.

[21] Appl. No.: 414,606

[22] Filed: Sep. 3, 1982

[51] Int. Cl.³ .......................... C25D 5/02; C25D 3/46
[52] U.S. Cl. ................................. 204/15; 204/46 R
[58] Field of Search ............................. 204/15, 46 R

[56] References Cited

U.S. PATENT DOCUMENTS

| | | | |
|---|---|---|---|
| 3,013,955 | 12/1961 | Roberts | 204/15 |
| 4,144,139 | 3/1979 | Durkee | 204/15 |
| 4,251,327 | 2/1981 | Grenou | 204/15 |

OTHER PUBLICATIONS

Patent Application Buckley et al. 3-15-6-6-6 Ser. No. 272,517, filed 6-11-81.

Primary Examiner—T. M. Tufariello
Attorney, Agent, or Firm—Walter G. Nilsen

[57] ABSTRACT

A process is described for plating silver on metallic surfaces electrically attached to a compound semiconductor. This process involves a photoelectrochemically induced oxidation reaction in which the compound semiconductor is oxidized and reduction to metallic silver takes place on the metallic surface electrically connected to the semiconductor. This procedure is particularly valuable where silver is to be plated in small holes or crevices in the semiconductor structure. It is particularly valuable because plating is specific to the metallic surface and does not occur on the semiconductor surface. It is useful in providing low inductance electrical connections to various parts of semiconductor devices such as in the source for gallium arsenide field effect transistors. Silver is particularly valuable in such applications because of its chemical inertness, high electrical conductivity and exceptionally high thermal conductivity which permits high transistor power handling capabilities.

23 Claims, 3 Drawing Figures

PHOTOELECTROCHEMICAL PLATING OF SILVER

TECHNICAL FIELD

The invention is a process for plating silver on metallic surfaces electrically attached to a compound semiconductor surface. In one embodiment of the invention, the silver is plated in small via holes in certain types of device structures.

BACKGROUND OF THE INVENTION

The semiconductor field has undergone tremendous change in the past fiew years largely due to the development of new devices with higher frequencies, greater stabilities, smaller sizes and greater bandwidths. Many of these developments have been due to the fact that new materials have been developed and new methods for processing these materials have been used. Some of the new techniques in fabricating semiconductor devices involve the use of smaller sizes, greater precision in locating various features on the semiconductor device, greater adherence of metallic substances to semiconductor surfaces and greater control in plating metals on semiconductor surfaces.

A particular example is a device involving one or more compound semiconductors. Various types of devices can be made using compound semiconductors including semiconductor lasers, photodetectors, light emitting diodes, and amplifiers. It is often necessary in the fabrication of such devices to particularly locate metallic substances to be used as conductors in precise places in the semiconductor device. A typical example is associated with the fabrication and structure of certain microwave semiconductor devices made from various compound semiconductors. Here, minimization of parasitic inductances is critical to good device performance. It permits higher frequency operation and more gain and bandwidth at these high frequencies. Also, more positive attachment of the metal such as silver to the metal pads insures good electrical contact and good thermal contact. This permits higher power handling capacity for the device and a higher and more predictable frequency characteristic for the device. Particularly advantageous is the use of silver in such applications because of its high chemical stability and its exceptionally high thermal and electrical conductivity characteristics. This permits high power handling capacity because of the large amount of heat conducted away from the semiconductor by the silver.

Particularly desirable is a reliable procedure for inducing chemical reduction at preselected areas in the compound semiconductor structure. In semiconductor processing, it is highly desirable that this be accomplished without electrical connection to individual devices. In most device fabrication procedures, a large number of devices are made from one semiconductor wafer and electrical connection to individual chips would be extremely difficult and time consuming. In particular, a silver plating procedure which was highly specific regarding where plating took place would be highly advantageous in fabricating many semiconductor devices.

SUMMARY OF THE INVENTION

The invention is a process for fabricating compound semiconductor devices in which at least one step involves plating silver on a metallic surface electrically attached to the semiconductor compound. This silver plating is induced by photoelectrochemical oxidation of the compound semiconductor material. The compound semiconductor may be undoped, intrinsic, or n-type. The silver plating process involves chemical reduction of a silver containing species at the surface of the metal. Often the metallic surface is gold or silver although any other metallic surface may be used. The process is carried out in an electrolyte which dissolves the oxidation products of the semiconductor and contains a source of silver to be plated, which on reduction yields metallic silver. A particularly advantageous embodiment of the invention is silver plating of via holes in gallium arsenide field-effect transistors. This process permits silver plating without a power supply, without electrical connections, or wires attached to the individual semiconductor devices. In the fabrication of large numbers of individual semiconductor devices on a wafer, this is highly advantageous. Excellent plating results are obtained even in small crevices and holes too small for conventional plating procedures. The procedure yields plated silver with good thermal and electrical contact to the metallic surface. In addition, the plated silver itself has good thermal conductivity and good electrical conductivity. This increases the power handling capacity of the devices and reduces electrical resistance effects. In addition, when the process is used to electrically connect the source pads of gallium arsenide field effect transistor devices to the header by way of a via hole, more reliable and reproducible devices are obtained with better heat handling capabilities and higher frequency handling capacities.

DETAILED DESCRIPTION

Figure 1:
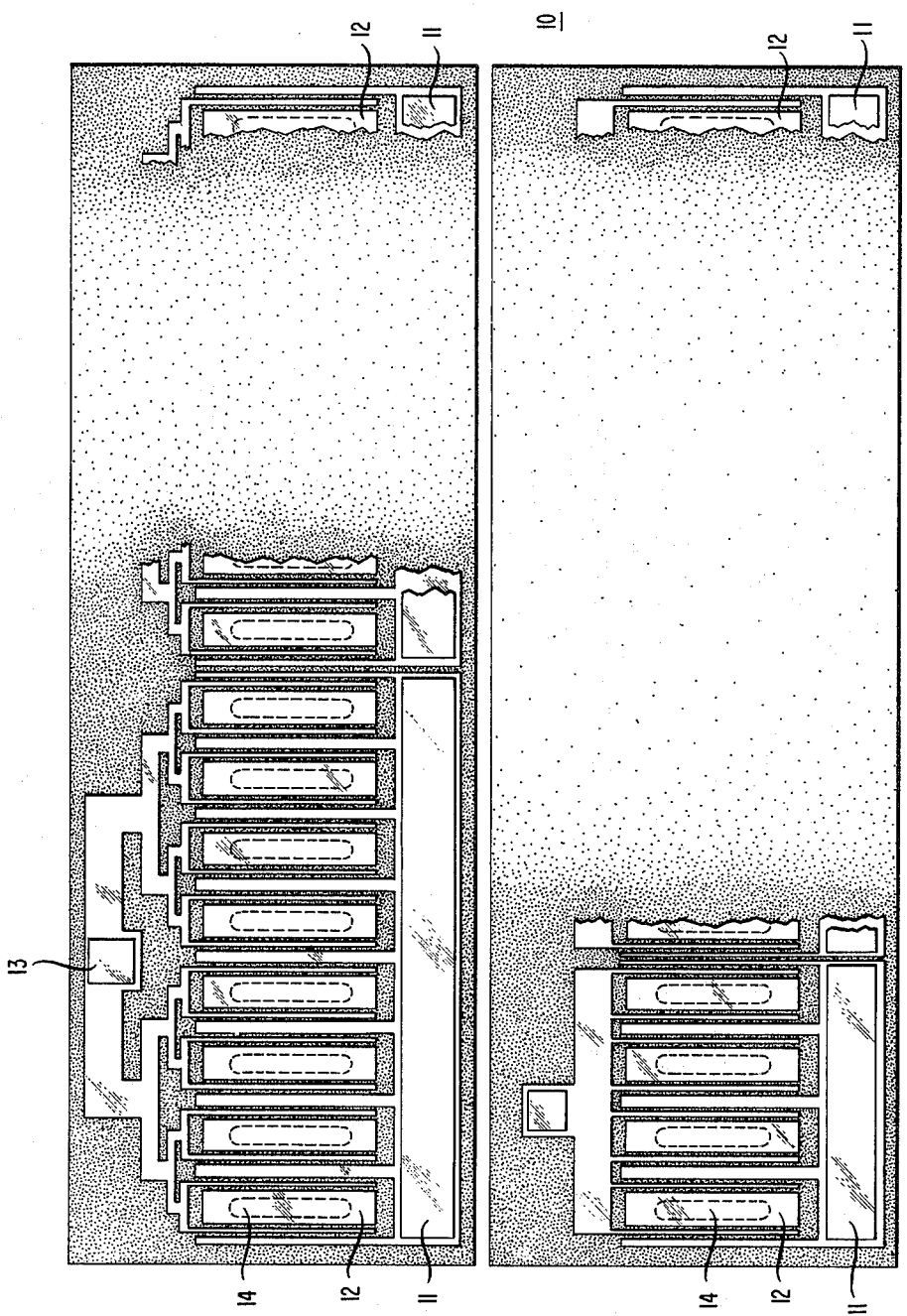
FIG. 1 shows a top view of part of a semiconductor wafer showing several individual devices (gallium arsenide field-effect transistors)

In broad terms, the invention arises from the discovery that silver can be plated on a metallic surface electrically connected to an insulating (undoped) or n-type compound semiconductor by photo-oxidizing the compound semiconductor in a suitable solution. Both III-V and II-VI compound semiconductors are useful in the practice of the invention. The essential steps in this procedure involve photo-oxidizing the compound semiconductor and allowing reduction to occur on a metal surface attached to the surface of the compound semiconductor. The solution is provided with a soluble species which on reduction yields metallic silver for plating on the metal surface. The solution should dissolve the oxidation products of the photo-oxidation of the compound semiconductor. Often a substance is added to the solution or the pH of the solution is adjusted so as to ensure dissolution of these oxidation products. Such dissolution ensures continuity of the plating process.

The invention applies most particularly to pure (undoped) compound semiconductors, to semi-insulating compound semiconductors that have been doped to form traps in the band gap and to n-type compound semiconductors. Essentially, the compound semiconductor should not be predominantly p-type. Generally, the hole concentration should not exceed the electron concentration by more than a factor of 100. In essence, the semiconductor properties should be such that the hole concentration is significantly changed in the photo-oxidation part of the process, that is by irradiation of the surface of the semiconductor. This in turn brings holes to the surface so as to participate in the photo-oxidation reaction. Further, the invention pertains especially to III-V compound semiconductors since these semiconductors are used extensively in commercially important devices.

Typical III-V semiconductor compounds are GaP, GaAs, AlAs, AlP, AlSb, InP, InSb, InAs, GaInAs, GaInP, GaInAsP, GaAlP and GaAlAs. Particularly important from a device point of view are the III-V compounds GaP, GaAs, GaInAs, GaInP, GaInAsP and GaAlAs. The invention is usefully applied to undoped material as well as compensated material. A typical compensated material is chromium doped gallium arsenide. Here, doping is usually in the range from $10^{15}$ to $10^{19}$ Cr/cm$^3$, with $10^{16}$ to $10^{18}$ Cr/cm$^3$, preferred. This procedures yields resistivities generally greater than $10^6$ ohm-cm. Oxygen is also useful as a compensating material. In growth techniques where low impurity concentrations are obtained, substantially lower trap (chromium) concentrations may be used to produce semi-insulating material.

The invention is also useful in processing n-type compound semiconductors. Various methods well known in the art are available for making n-type compound semiconductors. Typical for III-V compounds is doping with group IV elements (i.e., Si, Ge, Sn) to substitute for the group III element in the semiconductor or doping with group VI elements (S, Se, Te) to substitute for the group V element in the semiconductor. Typical doping levels are $10^{16}$ to $10^{18}$ donor atoms per cubic centimeters. Also, non-stoichiometric growth of the III-V compound semiconductor might provide the n-type behavior.

The photoelectrochemical plating procedure involves various reactions taking place essentially simultaneously. The compound semiconductor, including the metal surface to be plated is immersed in an electrolytic solution which is described in more detail below. The surface of the compound semiconductor is illuminated with light that produces carriers in both the conduction band and the valence band. Generally, the energy of the light should be greater than the band gap of the semiconductor so as to produce the carriers in the two bands. However, light with energy equal to or less than the band gap might also be useful particularly where carriers originate from traps within the band gap. Often, broad band sources are used for convenience, but where precise definition of the light is useful, a collimated source or a laser source might be used. Light is also useful in providing conductivity from the region where oxidation of the semiconductor occurs to the metal surface where plating occurs. This is particularly desirable for semi-insulating semiconductors such as chromium-doped gallium arsenide because low conductivity might limit plating rate. Also, to limit plating to a particular area of the metal layer, part of the metal layer where plating is not wanted is often masked off. This masking is often accomplished by adhering the metal layer to a mounting surface, usually a transparent substrate. Typically, devices are made from semiconductor wafers attached to a transparent substrate such as a sapphire disk.

A great variety of elecrolytic solutions may be used in the practice of the invention. Generally, the electrolytic solution is aqueous because of availability and understanding of the properties of aqueous solutions. However, a non-aqueous solution of suitable properties may be used. The electrolytic solution should contain a source of silver (more precisely, a silver compound which on reduction yields metallic silver), optionally a substance which will dissolve the oxidation products of the compound semiconductor, optionally a salt which will ensure good ionic conductivity for the electrolytic solution and optionally a buffer to stabilize the pH of the solution.

A large variety of silver salts are useful as a source of silver in the electrolytic solution. Silver complexed with various ions is often used because of stability and high solubility. The limitations on the selection of silver salt (or more accurately, silver species in the electrolytic soltuion) involve the reduction potential of the silver salt compared to the flat band potential of the illuminated semiconductor. The reduction potential of the silver salt in the electrolytic solution should be between the flat band potential and the potential of the valence band maximum in the electrolytic solution. A silver salt with a more positive reduction potential than the valence band maximum will result in spontaneous plating on the semiconductor surface. A silver salt with a reduction potential more negative than the flat band potential either will not plate with illumination of the semiconductor surface or will plate inconveniently slow.

In intrinsic or semi-insulator material, the flat band potential is approximately half-way between conduction band minimum and the valence band maximum. For n-type semiconductor material, the flat band potential is close to the conduction band minimum.

Although the exact value of many of the quantities is often not known, the considerations outlined above are of great value in selecting suitable silver salts and electrolytic solution for a particular application or semiconductor compound.

A particularly convenient way of measuring the parameters referred to above is to measure the voltammogram of the semiconductor compound and silver salt in the electrolytic solution of interest with and without illumination of the surface. A voltammogram is a plot of current versus potential applied to the compound semiconductor with respect to a reference electrode. With surface illumination, the initial output of current (as the potential on the hydrogen scale is made more and more positive) represents approximately the potential of the conduction band minimum in that particular electrolytic solution. Without illumination, the initial increase in current is more positive than the potential of the valence band maximum. The reduction potential of the source of silver in the electrolytic solution to be used in the process should be between these two potentials (the conduction band minimum and the valence band maximum). Best results are usually obtained where the reduction potential of the silver salts is toward the middle between the conduction and the valence band potentials.

Where uncertainty exists as to the electrochemical properties of the silver salt, a voltammogram can be run on the silver salt in the electrolytic solution of interest. Here, the ideal silver salt should show no reduction current at a potential more positive than the potential at the valence band maximum (where oxidation first appeared in the dark in the voltammogram of the compound semiconductor) but show reduction between the above potential and the potential of the conduction band minimum. Such experiments can be done rapidly and easily so as to select suitable silver salts for this process. Also, the shape of the voltammogram and comparison between the voltammogram of the compound semiconductor and silver salt should yield some information about likely plating rates.

Because of availability and stability, silver cyanide ion is preferred as a source of silver. Usually, $KAg(CN)_2$ is made by adding AgCn and KCN to the solution. Other silver complexes are useful, such as complexes with aliphatic polyamine compounds with up to 20 carbon atoms. The polyamine 1,3-diaminopropane yielded particularly good results. Concentrations of silver may vary over a large range and are usually adjusted to give reasonable lifetimes to the solution without excessive investment of silver. Typical concentrations are from 0.005 to 1.0 molar. Excess cyanide and excess complexing agent is often used, typically in the range from 0.1 to 10 times the concentration of silver.

Substances useful in dissolving the oxidation products of the compound semiconductor depend on the particular compound involved. Often moderate amounts of acid or base are enough to ensure solubility. Typically, pH values less than 4 or greater than 8 are preferred. In the case of aluminum and to some extent indium, an acidic solution is preferred, and the addition of chloride ion is often helpful in dissolving the resulting oxide. In the case of gallium arsenide, the presence of phosphate ion, which is part of the buffer system, is usually sufficient to ensure dissolution of the oxidation products. The addition of conducting salts is also beneficial. Typical amounts are 0.05 to 1 molar solutions. Any substance that is substantially ionized and does not interfere in the oxidation-reduction process can be used. This requirement is often met by substances serving other functions in the solution such as a buffer or a substance to ensure dissolution of the oxidation products of the semiconductor.

Although a buffer system is not required to carry out the procedure, it does ensure stability of the pH in the electrolytic solution which tends to stabilize the reaction. Typically buffer systems are the phosphate system (both the dihydrogen phosphate-hydrogen phosphate system and the hydrogen phosphate-phosphate system) and the citrate system. The concentrations involved may vary over large limits and are generally typical of those used in conventional electroplating processes. Typically, 0.05 to 1.0 molar solutions are used.

Often the electrolytic solution is made basic by the addition of an alkaline agent such as an alkali-metal hydroxide or carbonate. Typical agents are KOH and $K_2CO_3$.

The temperature of the process may vary over large limits, including from the freezing point to the boiling point of the electrolytic solution. Often, room temperature is preferred for convenience; but where more rapid plating is desired, a temperature between 40 and 75 degrees C. is preferred. A plating temperature between 50 and 60 degrees C. is most preferred.

The invention is advantageously illustrated by a description of a device and a description of the process used to plate silver in making the device. FIG. 1 shows a top view of a portion of a semiconductor wafer 10 with a variety of electrodes including drains 11, sources 12 and gates 13. Two different devices are contained on the same wafer, one with four sources and one with eight sources. The via holes 14 to be filled with silver are under the source pads.

Figure 2:
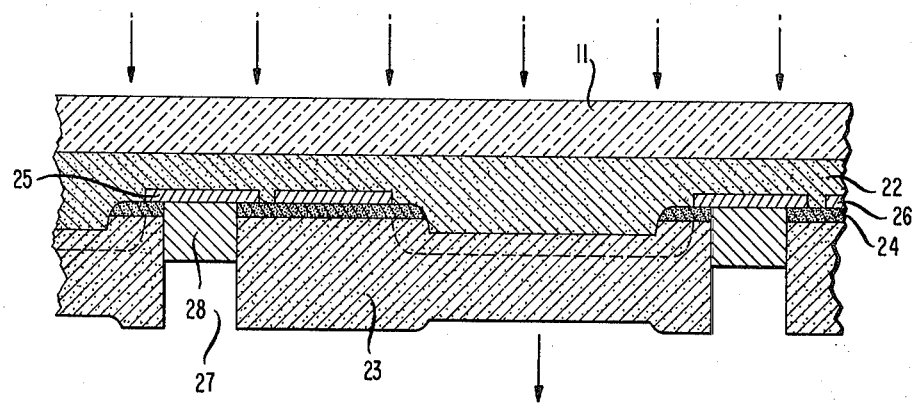
FIG. 2 shows a side view of a gallium arsenide field effect transistor in which silver has been plated in a via hole leading to the source pad.

A side view of a similar gallium arsenide field effect transistor is shown in FIG. 2. The device is only partially complete and does not show the gate pad. The wafer is mounted on a sapphire disk 21, using a conventional wax 22. Much of the processing has already been done on the device. The main body of the device is made of semi-insulating gallium arsenide 23 made by doping gallium arsenide with appproximately $10^{17}$ $Cr/cm^3$. Various layers are put down onto the semi-insulating GaAs. An epitaxial layer 24 of n-type gallium arsenide is grown on the semi-insulating gallium arsenide and source pad 25 as well as drain pad 26 are included as shown. Gate pads in a completed device are located between the source pads and the drain pads. The inventive process is useful in filling or partially filling the via holes 27 with silver 28 as shown. Usually the holes need not be completely filled since subsequent processing involves plating silver or gold over the entire bottom surface of the device, and this silver or gold plating fills the remainder of the holes. The particular advantage of silver filled via holes is the greater thermal conductivity over gold permitting better device operation. Individual devices are separated (often with a number of source-drain combinations on a single device) and brazed to a header. The brazing material is usually a gold-tin alloy. It is advantageous to keep the gold-tin alloy away from the source pads and the inside part of the via holes. The surface was cleaned in an oxygen plasma. This pretreatment prevented spurious silver plating on the sides of the via holes and on the surface of the gallium arsenide.

The wafers mounted on the sapphire disk were immersed in an aqueous plating solution composed of 0.3 molar AgCn, 1.0 molar KCN and 0.1 molar $K_2CO_3$. The plating process was carried out at room temperature. Moderate bath agitation is normally used and the light intensity may be used to adjust the silver plating rate. Illumination was provided with a 500 watt tungsten iodide lamp and a lens was used to collect radiation and make the radiation rays essentially parallel. These provisions are not necessary but provide more efficient use of the light output from the lamp and a more uniform distribution of radiation on the surface of the semiconductor wafer.

Illumination can be from either side of the device (either through the sapphire disk or onto the bottom).

A typical procedure for plating silver in the via holes is as follows:

After the via hole has been made, typically by a plasma etching technique, the wafers were subjected to a cleaning procedure. First, the wafers were immersed in a cyanide solution (typically 0.2 molar KCN) saturated with oxygen. This solution dissolved any gold sputtered from the source pads during plasma etching. The wafer is then further cleaned in either of two ways. It is exposed to a solution of 3 parts sulfuric acid, 1 part peroxide and 1 part water. Or, it is exposed to an oxygen plasma etching procedure. Generally, it is more convenient and better results are obtained when illumination is through the sapphire disk.

Additional experiments were carried out not only with the plating bath described above but also with other electrolytic solutions. The data for these experiments are summarized in Table I. At least 10 experiments were carried out with each electrolytic solution to produce the averages and statistical errors set forth in the table.

TABLE I

Silver Plating of Via Holes

| Components | Conc. (M) | pH | Plating Time (hrs.) | Original Depth (μm) | Final Depth (μm) | Thickness (μm) | Plating Rate (μm/min.) |
| --- | --- | --- | --- | --- | --- | --- | --- |
| AgCn | 0.3 | | | | | | |
| KCN | 1.0 | — | 3.0 | 43.2 + 4.2 | 20.7 ± 6.1 | 22.5 ± 2.8 | 0.13 ± 0.02 |
| $K_2CO_3$ | 0.1 | | | | | | |
| AgCN | 0.3 | | | | | | |
| KCN | 1.0 | | | | | | |
| $K_2CO_3$ | 0.1 | 12.6 | 2.0 | 44.0 ± 3.9 | 20.6 ± 2.9 | 23.4 ± 4.1 | 0.20 ± 0.03 |
| DAP* | 0.2 | | | | | | |
| $AgNO_3$ | 0.1 | | | | | | |
| KCN | 0.01 | | | | | | |
| $K_2HPO_4$ | 0.2 | 10.5 | 4.0 | 40.4 ± 3.1 | 9.9 ± 7.8 | 30.1 ± 6.2 | 0.13 ± 0.03 |
| $K_3PO_4$ | 0.1 | | | | | | |
| DAP* | 0.2 | | | | | | |

*1,3 diaminopropane

Examination of these via holes under a microscope (usually after chemically etching away the GaAs with an aqueous etching solution of three parts sulfuric acid, one part peroxide solution and one part water) showed that the plated silver filled the holes without voids and formed an excellent electrical and thermal contact with the source pads.

Figure 3:
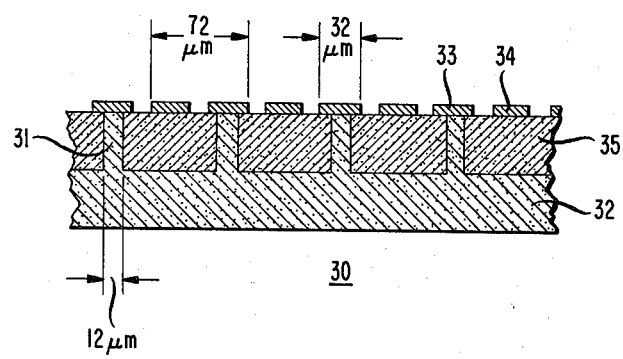
FIG. 3 shows a cut-away view of a portion of a gallium arsenide wafer with gold header attached to the semiconductor device and to the silver-filled via hole.

FIG. 3 shows a side view of a semiconductor wafer 30 with a number of GaAs-FET in which the via hole 31 is filled with silver and the silver plating 32 on the bottom side of the device is completed. Shown are the source pads 33, drain pads 34 and the semi-insulating GaAs 35. The various dimensions of a typical device are also shown.

What is claimed is:

1. A process for fabricating devices comprising at least one n-type or intrinsic compound semiconductor material comprising the step of plating silver on a metallic surface electrically connected to the III-V compound semiconductor by an oxidation-reduction reaction in an electrolytic solution characterized in that
   a. the oxidation is carried out by illuminating the III-V compound semiconductor so as to create holes that permit oxidation of the semiconductor,
   b. the electrolytic solution comprises a source of silver which on reduction yields metallic silver in which the reduction potential of the source of silver in the electrolytic solution is between the potential of the valence band maximum in the electrolytic solution and the potential of the conduction band minimum in the electrolytic solution, and
   c. the source of silver is reduced on the metallic surface to form metallic silver.

2. The process of claim 1 in which the compound semiconductor is a III-V compound.

3. The process of claim 2 in which the III-V compound semiconductor is selected from the group consisting of GaP, GaAs, AlAs, AlP, AlSb, InP, InSb, InAs, GaInAs, GaInP, GaInAsP, GaAlP and GaAlAs.

4. The process of claim 3 in which the III-V compound semiconductor is selected from the group consisting of GaP, GaAs, GaInAs, GaInP, GaInAsP and GaAlAs.

5. The process of claim 4 in which the III-V semiconductor compound is GaAs.

6. The process of claim 1 in which the compound semiconductor is undoped.

7. The process of claim 1 in which the compound semiconductor is semi-insulating GaAs.

8. The process of claim 7 in which the GaAs is made semi-insulating by doping with chromium in the concentration range from $10^{15}$ to $10^{19}$ Cr/$cm^3$.

9. The process of claim 1 in which the compound semiconductor is n-type.

10. The process of claim 9 in which the compound semiconductor is made n-type by doping with at least one element selected from the group consisting of Si, Ge, Sn, S, Se and Te.

11. The process of claim 1 in which the source of silver is $Ag(CN)_2^-$.

12. The process of claim 1 in which the electrolytic solution is made by adding AgCN and KCN to water.

13. The process of claim 12 in which the concentration of silver is between 0.005 and 1 molar and the concentration of excess cyanide ion ranges from 0.1 to 10 times the molar concentration of silver.

14. The process of claim 1 in which the electrolytic solution comprises at least one aliphatic polyamine compound with up to 20 carbon atoms.

15. The process of claim 14 in which the aliphatic polyamine compound is 1,3-diaminopropane.

16. The process of claim 1 in which the pH of the electrolytic solution is less than 4.

17. The process of claim 1 in which the pH of the electrolytic solution is greater than 8.

18. The process of claim 1 in which the electrolytic solution contains chloride ion.

19. The process of claim 1 in which the electrolytic solution is buffered.

20. The process of claim 1 in which the electrolytic solution comprises conducting salts.

21. The process of claim 1 in which the compound semiconductor is gallium arsenide, the silver is plated in a via hole and onto a source pad and the electrolytic solution comprises 0.3 molar AgCN, 1.0 molar KCN and 0.1 molar $K_2CO_3$ in water.

22. The process of claim 21 in which the electrolytic solution comprises in addition 0.2 molar 1,3-diaminopropane.

23. The process of claim 1 in which the compound semiconductor is gallium arsenide, the silver is plated in a via hole and onto a source pad and the electrolytic solution comprises 0.1 molar $AgNO_3$, 0.01 molar KCN, 0.2 molar $K_2HPO_4$, 0.1 molar $K_3PO_4$ and 0.2, molar 1,3-diaminopropane.

* * * * *